(12) United States Patent
Tai et al.

(10) Patent No.: US 9,264,058 B1
(45) Date of Patent: Feb. 16, 2016

(54) ANALOG-TO-DIGITAL CONVERTING DEVICE AND RELATED CALIBRATION METHOD AND CALIBRATION MODULE

(71) Applicant: Sitronix Technology Corp., Hsinchu County (TW)

(72) Inventors: Hung-Yen Tai, Hsinchu County (TW); Yao-Sheng Hu, Hsinchu County (TW)

(73) Assignee: Sitronix Technology Corp., Jhubei, Hsinchu County (TW)

( * ) Notice: Subject to any disclaimer, the term of this patent is extended or adjusted under 35 U.S.C. 154(b) by 0 days.

(21) Appl. No.: 14/797,192

(22) Filed: Jul. 13, 2015

(30) Foreign Application Priority Data

May 13, 2015 (TW) .............................. 104115165 A

(51) Int. Cl.
*H03M 1/10* (2006.01)
*H03M 1/00* (2006.01)
*H03M 1/46* (2006.01)

(52) U.S. Cl.
CPC ............ *H03M 1/1014* (2013.01); *H03M 1/002* (2013.01); *H03M 1/1009* (2013.01); *H03M 1/462* (2013.01); *H03M 1/468* (2013.01)

(58) Field of Classification Search
CPC ... H03M 1/1014; H03M 1/462; H03M 1/468; H03M 1/002; H03M 1/1009
USPC ................................................... 341/120, 155
See application file for complete search history.

(56) References Cited

U.S. PATENT DOCUMENTS

| 4,989,002 A * | 1/1991 | Tan ...................... H03M 1/0682 341/120 |
| 6,707,403 B1 * | 3/2004 | Hurrell ................ H03M 1/1061 341/120 |
| 8,451,151 B2 * | 5/2013 | Lin ...................... H03M 1/1061 341/110 |
| 8,981,973 B2 * | 3/2015 | Kumar ................ H03M 1/0617 341/118 |

* cited by examiner

*Primary Examiner* — Brian Young
(74) *Attorney, Agent, or Firm* — Winston Hsu; Scott Margo

(57) ABSTRACT

An analog-to-digital converting device includes a converting module for sampling an input voltage according to a plurality of sampling signals, to generate a comparing signal; a control module, for adjusting the plurality of sampling signal according to the comparing signal, to generate a first digital signal corresponding to the input voltage and a plurality of weights; and a calibration module, for adjusting the plurality of sampling signal according to the first digital signal to make the control module generate a second digital signal and for adjusting the plurality of weights according to the first digital signal and the second digital signal; wherein the second digital signal is different from the first digital signal and is corresponding to the plurality of weights.

10 Claims, 7 Drawing Sheets

| Sampling times | Draw1 | Draw2 | WSET | WSETxDraw2 -WSETxDraw1 | Adjusted WSET |
|---|---|---|---|---|---|
| 1 | 1000100101010 | 0111001010100 | [448 256 144 80 46 24 12 8 4 2 1] | 496 − 504 = −8 | [448−8 256 144 80 46 24 12 8 4 2 1] |
| 2 | 1000100101010 | 0111001010100 | [440 256 144 80 46 24 12 8 4 2 1] | 496 − 496 = 0 | [440+0 256 144 80 46 24 12 8 4 2 1] |
| 3 | 0100010101000 | 0011101011010 | [440 256 144 80 46 24 12 8 4 2 1] | 292 − 288 = 4 | [440+4 256+4 144 80 46 24 12 8 4 2 1] |
| 4 | 0100010101000 | 0011101011010 | [444 260 144 80 46 24 12 8 4 2 1] | 292 − 292 = 0 | [444+0 260 144 80 46 24 12 8 4 2 1] |

FIG. 3

| Sampling times | Draw1 | Draw2 | WSET | WSETxDraw2 -WSETxDraw1 | Adjusted WSET |
|---|---|---|---|---|---|
| 1 | 10001001010 | 01110010100 | [448 256 144 80 46 24 12 8 4 2 1] | 496 − 504 = −8 | [448-8 256 144 80 46 24 12 8 4 2 1] |
| 2 | 10001001010 | 01110010100 | [440 256 144 80 46 24 12 8 4 2 1] | 496 − 496 = 0 | [440+0 256 144 80 46 24 12 8 4 2 1] |
| 3 | 01000101000 | 00111011010 | [440 256 144 80 46 24 12 8 4 2 1] | 292 − 288 = 4 | [440 256+4 144 80 46 24 12 8 4 2 1] |
| 4 | 01000101000 | 00111011010 | [440 260 144 80 46 24 12 8 4 2 1] | 292 − 292 = 0 | [440 260+0 144 80 46 24 12 8 4 2 1] |
| 5 | 10001001010 | 01110010100 | [440 260 144 80 46 24 12 8 4 2 1] | 500 − 496 = 4 | [440+4 260 144 80 46 24 12 8 4 2 1] |
| 6 | 10001001010 | 01110010100 | [444 260 144 80 46 24 12 8 4 2 1] | 500 − 500 = 0 | [444+0 260 144 80 46 24 12 8 4 2 1] |

FIG. 4

| Sampling times | Draw1 | Draw2 | WSET | WSETxDraw2 -WSETxDraw1 | Adjusted WSET |
|---|---|---|---|---|---|
| 1 | 01110000000 | 10000110100 | [448 256 144 80 46 24 12 8 4 2 1] | 488 − 480 = 8 | [448−8 256 144 80 46 24 12 8 4 2 1] |
| 2 | 01110000000 | 10000110100 | [440 256 144 80 46 24 12 8 4 2 1] | 480 − 480 = 0 | [440+0 256 144 80 46 24 12 8 4 2 1] |
| 3 | 00111000000 | 01000001010 | [440 256 144 80 46 24 12 8 4 2 1] | 266 −270 = −4 | [440 256+4 144 80 46 24 12 8 4 2 1] |
| 4 | 00111000000 | 01000001010 | [440 260 144 80 46 24 12 8 4 2 1] | 270 − 270 = 0 | [440 260+0 144 80 46 24 12 8 4 2 1] |
| 5 | 01110000000 | 10000110100 | [440 260 144 80 46 24 12 8 4 2 1] | 480 − 484 = −4 | [440+4 260 144 80 46 24 12 8 4 2 1] |
| 6 | 01110000000 | 10000110100 | [444 260 144 80 46 24 12 8 4 2 1] | 484 − 484 = 0 | [444+0 260 144 80 46 24 12 8 4 2 1] |

ANALOG-TO-DIGITAL CONVERTING DEVICE AND RELATED CALIBRATION METHOD AND CALIBRATION MODULE

BACKGROUND OF THE INVENTION

1. Field of the Invention

The present invention relates to an analog-to-digital converting device and related calibration method and calibration module, and more particularly, to an analog-to-digital converting device capable of eliminating non-ideal effects via adjusting the bit weights of the output digital signal and related calibration method and calibration module.

2. Description of the Prior Art

A successive approximation register (SAR) analog-to-digital converter (ADC) is a type of ADC applying the binary search algorithm in the analog-to-digital conversion process. Generally, the conversion time of the SAR ADC is limited by the external conversion clock. In each clock period of the conversion clock, the SAR ADC samples an analog input and generates bits of a corresponded digital output bit by bit from the most significant bit (MSB) to the least significant bit (LSB).

When the circuit components in the SAR ADC deviates from the original designs as a result of process variations, the resolution of the SAR ADC is downgraded. The non-ideal effects resulting from the process variation can be reduced via increasing the areas of the circuit components. However, the increases in the areas of the circuit components raise the power consumption and increase the chip area of the SAR ADC. Thus, how to reduce the non-ideal effects of the process variation without affecting the circuit performance and the manufacturing cost becomes a topic to be discussed.

SUMMARY OF THE INVENTION

In order to solve the above problem, the present invention provides an analog-to-digital converting device capable of eliminating non-ideal effects via adjusting the bit weights of the output digital signal and related calibration method and calibration module.

The present invention discloses an analog-to-digital converting device. The analog-to-digital converting device comprises a converting module, for sampling an input voltage according to a plurality of sampling signals, to generate a comparing signal; a control module, for adjusting the plurality of sampling signals according to the comparing signal, to generate a first digital signal corresponding to the input voltage and a plurality of weights; and a calibration module, for adjusting the plurality of sampling signal according to the first digital signal to make the control module generate a second digital signal according to the comparing signal and for adjusting the plurality of weights according to the first digital signal and the second digital signal; wherein the second digital signal is different from the first digital signal and is corresponding to the plurality of weights.

The present invention further discloses a calibration method for an analog-to-digital converting device. The analog-to-digital converting device samples an input voltage according to a plurality of sampling signals to generate a comparing signal and adjusting the plurality of sampling signals according to the comparing signal, so as to generate a first digital signal corresponding to the input voltage and a plurality weights. The calibration method comprises adjusting the plurality of sampling signals according to the first digital signal, to generate a second digital signal, wherein the second digital signal is different from the first digital signal and corresponds to the plurality weights; and adjusting the plurality of weights according to the first digital signal and the second digital signal.

The present invention further discloses a calibration module for an analog-to-digital converting device. The analog-to-digital converting device samples an input voltage according to a plurality of sampling signals to generate a comparing signal and adjusting the plurality of sampling signal according to the comparing signal, so as to generate a first digital signal corresponding to the input voltage and a plurality weights. The calibration module comprises a processing unit; and a storage unit, for storing a program code, wherein the program code instructs the processing unit performing the following steps: adjusting the plurality of sampling signals according to the first digital signal, to generate a second digital signal, wherein the second digital signal is different from the first digital signal and corresponds to the plurality weights; and adjusting the plurality of weights according to the first digital signal and the second digital signal.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 3-5 are schematic diagrams of related signals of the analog-to-digital converting device shown in FIG. 2.

DETAILED DESCRIPTION

Figure 1:
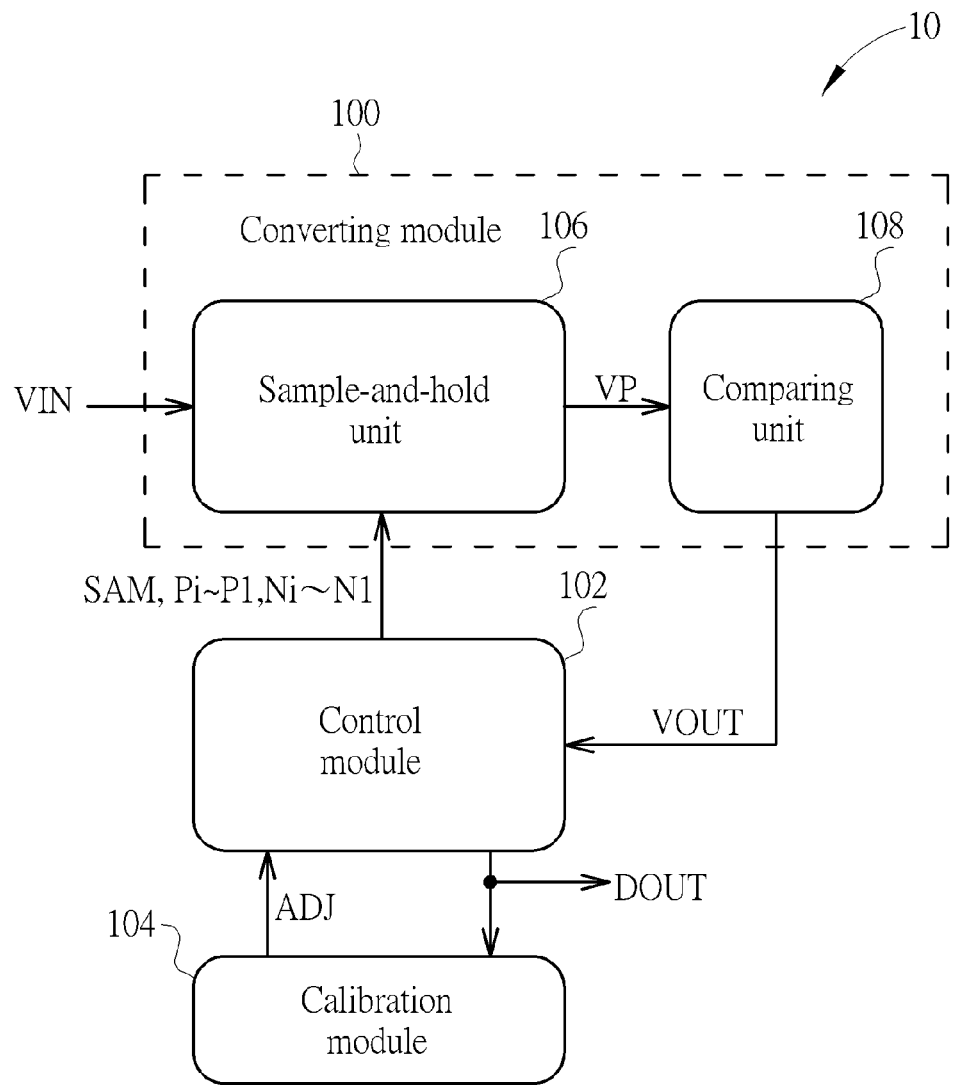
FIG. 1 is a schematic diagram of an analog-to-digital converting device according to an example of the present invention.

Please refer to FIG. 1, which is a schematic diagram of an analog-to-digital converting device 10 according to an example of the present invention. The analog-to-digital converting device 10 may be a successive approximation register (SAR) analog-to-digital converter (ADC) and is utilized for converting an input voltage VIN to a digital output signal DOUT. As shown in FIG. 1, the analog-to-digital converting device 10 comprises a converting module 100, a control module 102, and a calibration module 104. The converting module 100 comprises a sample-and-hold unit 106 and a comparing unit 108, and is utilized for generating a comparing signal VOUT by sampling the input voltage VIN according to sampling signals SAM, Pi-P1 and Ni-N1. The control module 102 adjusts the sampling signals SAM, Pi-P1 and Ni-N1 according to the comparing signal VOUT, to acquire bits Di-D0 of the digital output signal DOUT. The bits Di-D0 are corresponding to weights Wi-W0 of a weight set WSET and the sampling signals Pi-P1 and Ni-N1. The calibration module 104 is utilized for adjusting the weight set WSET according to the digital output signal DOUT, to eliminate non-ideal effects result from the process variation.

In details, when the analog-to-digital converting device 10 begins operating, the sample-and-hold unit 106 samples the input voltage VIN according to the sampling signal SAM to generate a voltage VP and adjusts the voltage VP according to the sampling signals Pi-P1 and Ni-N1. The comparing unit 108 generates the comparing signal VOUT to the control module 102 according to the voltage VP. Based on the comparing signal VOUT, the control module 102 first generates the most significant bit (MSB) Di of the digital output signal DOUT, and then adjusts the sampling signals Pi and Ni according to the bit Di. Next, the control module 102 generates the bit Di-1 subsequent to the bit Di according to the comparing signal VOUT, adjusts the sampling signals Pi-1 and Ni-1 according to the bit Di-1, and so on. Via repeating the above processes, the control module 102 sequentially generates the bits Di-D0 of the digital output signal DOUT, wherein the bits Di-D0 are corresponding to the weights Wi-W0 of the weight set WSET.

In this example, the weights Wi-W0 comprise at least one weight Wx whose value is smaller than a sum of values of the weights subsequent to the weight Wx among the weights Wi-W0 (i.e.

$$\text{i.e. } Wx < \sum_{y=0}^{x-1} Wy\text{).}$$

Under such a condition, the same input voltage VIN can be expressed by different digital output signals DOUT. When determining that the voltage VIN corresponding to the digital output signal DOUT can be expressed in different methods according to the digital output signal DOUT, the calibration module 104 stores the current digital output signal DOUT as a digital output signal Draw1. Next, the calibration module 104 adjusts the sampling signals Pi-P1 and Ni-N1 via a control signal ADJ, to make the control module 102 generate a different output signal DOUT to express the input voltage VIN. After the conversion process completes, the calibration module 104 stores the new digital output signal DOUT as a digital output signal Draw2. Via comparing the digital output signals Draw1 and Draw2, the calibration module 104 adjusts the weight set WSET, to eliminate the non-ideal effects of component mismatches in the analog-to-digital converting device 10.

Note that, in order to make the same input voltage VIN be expressed by different digital output signals DOUT, a weight Wj among the weights Wi-W0 is designed to be equal to or smaller than $2^j$ (i.e. Wj≤$2^j$, j∈[0,i]). In comparison with the analog-to-digital convertor (ADC) with bivariate distribution weights, the analog-to-digital converting device 10 requires more bits to express the same value. For example, the analog-to-digital converting device 10 whose digital output signal DOUT is i+1 bits may be an ADC whose resolution is bits.

Figure 2:
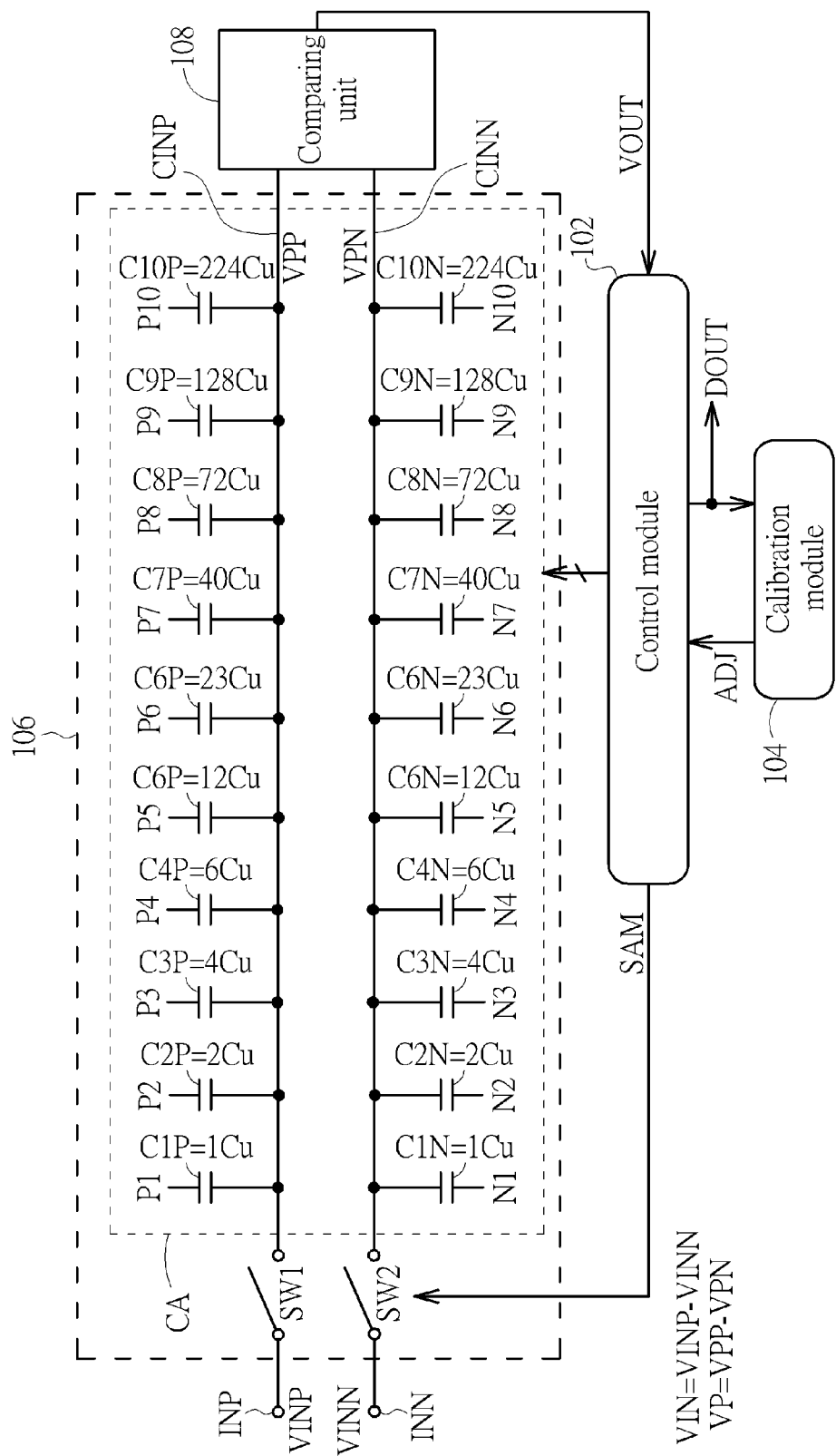
FIG. 2 is a schematic diagram of an implementation of the analog-to-digital converting device shown in FIG. 1.

As to detailed operations of the analog-to-digital converting device 10 please refer to the followings. Please refer to FIG. 2, which is a schematic diagram of an implementation of the analog-to-digital converting device 10 shown in FIG. 1. In this example, the analog-to-digital converting device 10 is a 10 bits ADC. The input voltage VIN is a voltage difference between a voltage VINP of an input end INP and a voltage VINN of an input end INN (i.e. VIN=VINP−VINN) and the voltage VP is a voltage difference between a voltage VPP of an input end CINP of the comparing unit 108 and a voltage VPN of an input end CINN of the comparing unit 108 (i.e. VP=VPP−VPN). The sample-and-hold unit 106 comprises switches SW1 and SW2, and a capacitor array CA, wherein the capacitor array CA comprises capacitors C1P-C10P and C1N-C10N. The capacitors C1P-C10P are coupled to the sampling signals P1-P10, respectively, and to the input end CINP. The capacitors C1N-C10N are coupled to the sampling signals N1-N10, respectively, and to the input end CINN. In addition, the capacitors C1P and C1N are corresponding to the bit D1 and the capacitances of the capacitors C1P and C1N are proportional to the weight W1; the capacitors C2P and C2N are corresponding to the bit D2 and the capacitances of the capacitors C2P and C2N are proportional to the weight W2; and so on. In FIG. 2, the weights W10-W0 of the weight set WET are [448, 256, 144, 80, 46, 24, 12, 8, 4, 2, 1]. Under such a condition, the capacitances of the capacitors C1P and C1N are a capacitance Cu (i.e. a unit capacitance), the capacitances of the capacitors C2P and C2N are a capacitance 2Cu, and so on.

Note that, the weight W10 is smaller than the sum of the weights W9-W0. That is, the weight W10 belongs to the above-mentioned weight Wx, which allows the same input voltage VIN to be expressed by different digital output signal DOUT. In this example, the weights W9-W4 also satisfy the conditions of the weight Wx.

When the analog-to-digital converting device 10 shown in FIG. 2 begins operating, the control module 102 switches the sampling signal SAM to disconnect the switches SW1 and SW2. The voltage VP is equal to the input voltage VIN and the sampling signals P10-P1 and N10-N1 are equal to a power source voltage VDD of the analog-to-digital converting device 10. Next, the comparing unit 108 generates the comparing signal VOUT according to the voltage VP and the control module 102 generates the bit D10 of the digital output signal DOUT according to the comparing signal VOUT. When the voltage VPP is greater than the voltage VPN, the control module 102 adjusts the bit D10 to a high-logic level (i.e. "1"), adjusts the sampling signal P10 to ground voltage, and keeps the sampling signal N10 the power source voltage VDD; and when the voltage VPP is smaller than the voltage VPN, the control module 102 adjusts the bit D10 to a low-logic level (i.e. "0"), keeps the sampling signal P10 the power source voltage VDD, and adjusts the sampling signal N10 to ground voltage. After the control module 102 generates the bit D10 and accordingly adjusts the sampling signals P10 and N10, the comparing unit 108 generates the comparing signal VOUT according to the adjusted voltage VP and then the control module 102 generates the bit D9 and adjusts the sampling signals P9 and N9. Via repeating the processes of generating the bits D10 and D9, the control module 102 sequentially generates the bits D8-D0 of the digital output signal DOUT.

In this example, the capacitances of the capacitors C1P-C10P and C1N-C10N may deviate from originally designed values as a result of the process variation. Under such a condition, the weights W10-W0 of the weight set WSET need to be appropriately adjusted, to eliminate the non-ideal effects result from the process variation. In order to achieve the above-mentioned goal, the calibration module 104 detects whether the digital output signal DOUT can be expressed by different methods. In an example, when a bit Dz among the bits D10-D0 is different from a plurality of bits subsequent to the bit Dz, the calibration module 104 determines the digital output signal DOUT can be expressed by different methods. Next, the calibration module 104 stores the current digital output signal DOUT as the digital output signal Draw1 and controls the control module 102 to adjust the sampling signals P10-P1 and N10-N1 to the power source voltage VDD via the control signal ADJ, to convert the voltage VP to the digital output signal DOUT again. In the second process of converting the voltage VP, the control module 102 sets the bit Dz of the digital output signal DOUT to be different from that of the digital output signal Draw1 according to the control signal ADJ. After the second process of converting the voltage VP completes, the calibration module 104 stores the new digital output signal DOUT as the digital output signal Draw2. The calibration module 104 adjusts the weight set WET according to a difference between a product PRO1 of the digital output signal Draw1 and the weight set WSET (i.e.

$$\left(\text{i.e. } Draw1 \times WSET = \sum_{y=0}^{10} (Wy \times Dy)\right)$$

and a product RPO2 of the digital output signal Draw2 and the weight set WSET, to eliminate the non-ideal effect of the process variation. In this example, the analog-to-digital converting device 10 does not need additional analog components to eliminate the non-ideal effect of the process variation. The manufacture cost and the design complexity of the analog-to-digital converting device 10 can be effectively reduced.

Please refer to FIG. 3, which is a schematic diagram of related signals of the analog-to-digital converting device 10 shown in FIG. 2. In FIG. 3, the bits D10-D0 of the digital output signal DOUT generated in first sampling process are 10001001010. Since the bit D10 is different from the bits D9-D7 subsequent to the bit D10, the calibration module 104 determines the digital output signal DOUT can be expressed by different methods and stores the digital output signal DOUT as the digital output signal Draw1. Next, the calibration module 104 controls the control module 102 to adjust the sampling signals P10-P1 and N10-N1 to the power source voltage VDD via the control signal ADJ, to convert the voltage VP to the digital output signal DOUT again. During the conversion process, the control module 102 sets the bit D10 to "0" according to the control signal ADJ and acquires 01110010100 as the digital output signal Draw2. After acquiring the digital output signals Draw1 and Draw2, the calibration module 104 calculates the products PRO2 and PRO1 (PRO1=504 and PRO2=496) and adds the difference between the products PRO2 and PRO1 (i.e. −8) to the weight W10. After the first sampling process, the weight set WSET changes to [440, 256, 144, 80, 46, 24, 12, 8, 4, 2, 1].

In second sampling process, the bits D10-D0 in the digital output signal DOUT of the analog-to-digital converting device 10 are 10001001010. Similar to the first sampling process, the calibration module 104 stores 10001001010 as the digital output signal Draw1 and acquires 01110010100 as the digital output signal Draw2 via the control signal ADJ. Since the weight W10 of the weight set WSET has been calibrated in the first sampling process, the products PRO1 and PRO2 are the same in the second sampling process. Thus, the calibration module 104 does not adjust the weight set WSET.

In third sampling process, the bits D10-D0 of the digital output signal DOUT generated by the analog-to-digital converting device 10 are 01000101000. Since the bit D9 is different from the bits D8-D6 subsequent to the bit D9, the calibration module 104 determines the digital output signal DOUT can be expressed by different methods and stores the digital output signal DOUT as the digital output signal Draw1. Next, the calibration module 104 controls the control module 102 to adjust the sampling signals P10-P1 and N10-N1 to the power source voltage VDD via the control signal ADJ, to convert the voltage VP to the digital output signal DOUT again. During the conversion process, the control module 102 sets the bit D9 to "0" according to the control signal ADJ and acquires 00111011010 as the digital output signal Draw2. After acquiring the digital output signals Draw1 and Draw2, the calibration module 104 calculates the products PRO1 and PRO2 (PRO1=288 and PRO2=292) and adds the difference between the products PRO2 and PRO1 (i.e. 4) to the weight W9. Note that, the calibration module 104 also adds the difference between the products PRO2 and PRO1 to the weight W10 in this example.

In fourth sampling process, the bits D10-D0 in the digital output signal DOUT of the analog-to-digital converting device 10 are 01000101000. Similar to the third sampling process, the calibration module 104 stores 01000101000 as the digital output signal Draw1 and acquires 00111011010 as the digital output signal Draw2 via the control signal ADJ. Since the weights W10 and W9 of the weight set WSET have been calibrated in the third sampling process, the products PRO1 and PRO2 are the same in the fourth sampling process. Thus, the calibration module 104 does not adjust the weight set WSET. Via repeating the above calibration processes, the calibration module progressively calibrates the weight set WSET, to achieve the goal of eliminating the non-ideal effects in the analog-to-digital converting device 10.

Please refer to FIG. 4, which is a schematic diagram of related signals when the analog-to-digital device 10 shown in FIG. 2 operates. The first and the second sampling processes in FIG. 4 are similar to those in FIG. 3, and are not narrated herein for brevity. In third sampling process shown in FIG. 4, the bits D10-D0 of the digital output signal DOUT generated by the analog-to-digital converting device 10 are 01000101000. Since the bit D9 is different from the bits D8-D6 subsequent to the bit D9, the calibration module 104 determines the digital output signal DOUT can be expressed by different methods and stores the digital output signal DOUT as the digital output signal Draw1. Next, the calibration module 104 controls the control module 102 to adjust the sampling signals P10-P1 and N10-N1 to the power source voltage VDD via the control signal ADJ, to convert the voltage VP to the digital output signal DOUT again. During the conversion process, the control module 102 sets the bit D9 to "0" according to the control signal ADJ and acquires 00111011010 as the digital output signal Draw2. After acquiring the digital output signals Draw1 and Draw2, the calibration module 104 calculates the products PRO1 and PRO2 (PRO1=288 and PRO2=292) and adds the difference 4 between the products PRO2 and PRO1 to the weight W9. In this example, the calibration module 104 does not jointly adjust the weight W10 when adjusting the weight W9.

In fourth sampling process, the bits D10-D0 in the digital output signal DOUT of the analog-to-digital converting device 10 are 01000101000. Similar to the third sampling process, the calibration module 104 stores 01000101000 as the digital output signal Draw1 and acquires 00111011010 as the digital output signal Draw2 via the control signal ADJ. Since the weight W9 of the weight set WSET has been calibrated in the third sampling process, the products PRO1 and PRO2 are the same in the fourth sampling process. Thus, the calibration module 104 does not adjust the weight set WSET.

In fifth sampling process, the bits D10-D0 of the digital output signal DOUT generated by the analog-to-digital converting device 10 are 10001001010. Since the bit D10 is different from the bits D9-D7 subsequent to the bit D10, the calibration module 104 determines the digital output signal DOUT can be expressed by different methods and stores the digital output signal DOUT as the digital output signal Draw1. Next, the calibration module 104 controls the control module 102 to adjust the sampling signals P10-P1 and N10-N1 to the power source voltage VDD via the control signal ADJ, to convert the voltage VP to the digital output signal DOUT again. During the conversion process, the control module 102 sets the bit D10 to "0" according to the control signal ADJ and acquires 01110010100 as the digital output signal Draw2. After acquiring the digital output signals Draw1 and Draw2, the calibration module 104 calculates the products PRO1 and PRO2 (PRO1=496 and PRO2=500) and adds the difference 4 between the products PRO2 and PRO1 to the weight W10.

Similar to the fifth sampling process, the bits D10-D0 in the digital output signal DOUT generated by the analog-to-digital converting device 10 in sixth sampling process are also 10001001010. The calibration module 104 stores 10001001010 as the digital output signal Draw1 and acquires 01110010100 as the digital output signal Draw2 via the control signal ADJ. Since the weights W10 and W9 of the weight set WSET have been calibrated in the first, the third, and the fifth sampling processes, the products PRO1 and PRO2 are the same in the sixth sampling process. Thus, the calibration module 104 does not adjust the weight set WSET. Via repeating the above calibration processes, the calibration module progressively calibrates the weight set WSET, to achieve the goal of eliminating the non-ideal effects in the analog-to-digital converting device 10.

Please refer to FIG. 5, which is a schematic diagram of related signals when the analog-to-digital device 10 shown in FIG. 2 operates. In first sampling process shown in FIG. 5, the analog-to-digital converting device 10 erroneously determines the bit D10 of the digital output signal DOUT and acquires 01110000000 as the bits D10-D0 of the digital output signal DOUT. Since the bit D10 is different from the bits D9-D7 subsequent to the bit D10, the calibration module 104 determines the digital output signal DOUT can be expressed by different methods and stores the digital output signal DOUT as the digital output signal Draw1. Next, the calibration module 104 controls the control module 102 to adjust the sampling signals P10-P1 and N10-N1 to the power source voltage VDD via the control signal ADJ, to convert the voltage VP to the digital output signal DOUT again. During the conversion process, the control module 102 sets the bit D10 to "1" according to the control signal ADJ and acquires 10000110100 as the digital output signal Draw2. After acquiring the digital output signals Draw1 and Draw2, the calibration module 104 calculates the products PRO1 and PRO2 (PRO1=480 and PRO2=488). Because the bit D10 of the digital output signal DOUT is set to "1" when acquiring the digital output signal Draw2, the calibration module 104 subtracts the difference 8 between the products PRO2 and PRO1 from the weight W10 in this example. After the first sampling process, the weight set WSET changes to [440, 256, 144, 80, 46, 24, 12, 8, 4, 2, 1].

Similar to the first sampling process, the bits D10-D0 in the digital output signal DOUT generated by the analog-to-digital converting device 10 in second sampling process are also 01110000000. The calibration module 104 stores 01110000000 as the digital output signal Draw1 and acquires 10000110100 as the digital output signal Draw2 via the control signal ADJ. Since the weight W10 of the weight set WSET has been calibrated in the first sampling process, the products PRO1 and PRO2 are the same in the second sampling process. Thus, the calibration module 104 does not adjust the weight set WSET.

In third sampling process shown in FIG. 5, the analog-to-digital converting device 10 erroneously determines the bit D9 of the digital output signal DOUT and acquires 00111000000 as the bits D10-D0 of the digital output signal DOUT. Since the bit D9 is different from the bits D8-D6 subsequent to the bit D9, the calibration module 104 determines the digital output signal DOUT can be expressed by different methods and stores the digital output signal DOUT as the digital output signal Draw1. Next, the calibration module 104 controls the control module 102 to adjust the sampling signals P10-P1 and N10-N1 to the power source voltage VDD via the control signal ADJ, to convert the voltage VP to the digital output signal DOUT again. During the conversion process, the control module 102 sets the bit D9 to "1" according to the control signal ADJ and acquires 01000001010 as the digital output signal Draw2. After acquiring the digital output signals Draw1 and Draw2, the calibration module 104 calculates the products PRO1 and PRO2 (PRO1=270 and PRO2=266). Because the bit D9 of the digital output signal DOUT is set to "1" when acquiring the digital output signal Draw2, the calibration module 104 subtracts the difference −4 between the products PRO2 and PRO1 from the weight W9 in this example.

Similar to the third sampling process, the bits D10-D0 in the digital output signal DOUT generated by the analog-to-digital converting device 10 in fourth sampling process are also 00111000000. Since the bit D9 is different from the bits D8-D6 subsequent to the bit D9, the calibration module 104 determines the digital output signal DOUT can be expressed by different methods. The calibration module 104 stores 00111000000 as the digital output signal Draw1 and acquires 01000001010 as the digital output signal Draw2 via the control signal ADJ. Since the weight W9 of the weight set WSET has been calibrated in the first sampling process, the products PRO1 and PRO2 are the same in the fourth sampling process. Thus, the calibration module 104 does not adjust the weight set WSET.

In fifth sampling process shown in FIG. 5, the analog-to-digital converting device 10 erroneously determines the bit D10 of the digital output signal DOUT and acquires 01110000000 as the bits D10-D0 of the digital output signal DOUT. Since the bit D10 is different from the bits D9-D7 subsequent to the bit D9, the calibration module 104 determines the digital output signal DOUT can be expressed by different methods and stores the digital output signal DOUT as the digital output signal Draw1. Next, the calibration module 104 controls the control module 102 to adjust the sampling signals P10-P1 and N10-N1 to the power source voltage VDD via the control signal ADJ, to convert the voltage VP to the digital output signal DOUT again. During the conversion process, the control module 102 sets the bit D10 to "1" according to the control signal ADJ and acquires 10000110100 as the digital output signal Draw2. After acquiring the digital output signals Draw1 and Draw2, the calibration module 104 calculates the products PRO1 and PRO2 (PRO1=484 and PRO2=480) and subtracts the difference −4 between the products PRO2 and PRO1 from the weight W10. After the fifth sampling process, the weight set WSET changes to [444, 260, 144, 80, 46, 24, 12, 8, 4, 2, 1].

Similar to the fifth sampling process, the bits D10-D0 in the digital output signal DOUT generated by the analog-to-digital converting device 10 in sixth sampling process are also 01110000000. Since the bit D10 is different from the bits D9-D7 subsequent to the bit D10, the calibration module 104 determines the digital output signal DOUT can be expressed by different methods. The calibration module 104 stores 01110000000 as the digital output signal Draw1 and acquires 10000110100 as the digital output signal Draw2 via the control signal ADJ. Since the weights W10 and W9 of the weight set WSET have been calibrated in the first, the third and the fifth sampling processes, the products PRO1 and PRO2 are the same in the sixth sampling process. Thus, the calibration module 104 does not adjust the weight set WSET. Via repeating the above calibration processes, the calibration module progressively calibrates the weight set WSET, to achieve the goal of eliminating the non-ideal effects in the analog-to-digital converting device 10.

According to different applications and design concepts, those with ordinary skill in the art may observe appropriate alternations and modifications. In an example, the calibration module 104 adjusts the step of adjusting the weight set WET in single calibration process according to a resolution of calibration process. When the resolution of calibration process increases, the step of adjusting the weight set WET in single calibration process changes to be smaller than the difference between the product PRO2 of the digital output signal Draw2 and the weight set WSET and the product PRO1 of the digital output signal Draw1 and the weight set WSET. For example, the step of adjusting the weight set WET in single calibration process can be 1, 0.5, 0.25 or 0.125, and is not limited herein. In another example, the step of the calibration module 104 adjusting the weight set WET in single calibration process is inverse proportional to the number of the calibration processes performed by the calibration modules, to balance the resolution and the calibration time.

In addition, the analog-to-digital converting device 10 may further comprise a storage module (not shown in FIGS. 1 and 2), utilized for storing the adjusted weight set WSET. When beginning operating, the analog-to-digital converting device 10 read the weight set WSET stored in the storage module as the reference of generating the digital output signal DOUT. The storage module may be a read-only memory (ROM), random-access memory (RAM), CD-ROM/DVD-ROM, magnetic tape, hard disk, and an optical data storage device.

Figure 6:
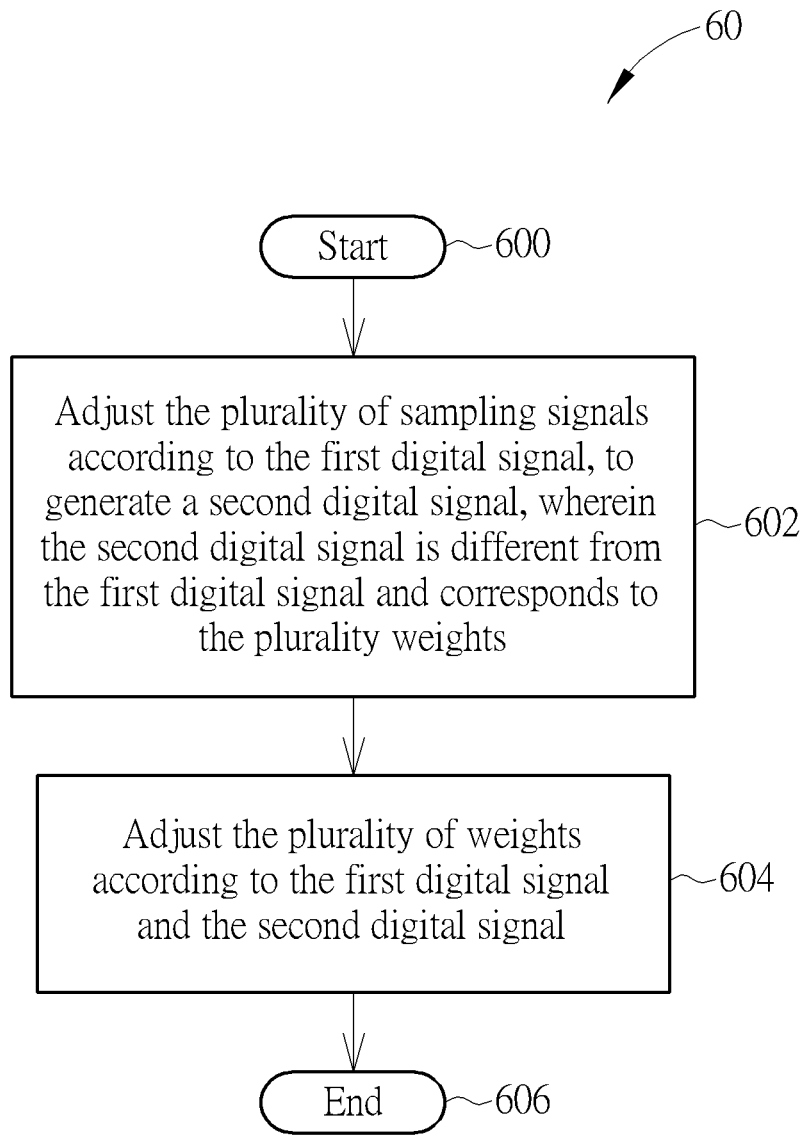
FIG. 6 is a flowchart of a calibration method according to an example of the present invention.

The process of the calibration module 104 adjusting the weight set WSET can be summarized into a calibration method 60 shown in FIG. 6. The calibration method 60 can be utilized in a calibration module of an analog-to-digital converting device. The analog-to-digital converting device samples an input voltage according to a plurality of sampling signals to generate a comparing signal and adjusts the plurality of sampling signals according to the comparing signal, to generate a first digital signal (e.g. the digital output signal Draw1) corresponding to the input voltage and a plurality of weights. Note that, the plurality of weights comprises a first weight whose value is smaller than a sum of values of the weights subsequent to the first weight among the plurality of weights. In other words, the analog-to-digital converting device is able to utilize different digital signal to express the same input voltage. The calibration method 60 comprises the following steps:

Step 600: Start.

Step 602: Adjust the plurality of sampling signals according to the first digital signal to generate a second digital signal, wherein the second digital signal is different from the first digital signal and corresponds to the plurality weights.

Step 604: Adjust the plurality of weights according to the first digital signal and the second digital signal.

Step 608: End.

According to the calibration method 60, the calibration module adjusts the plurality of sampling signals according to the first digital signal (e.g. the digital output signal Draw1), to acquire a second digital signal (e.g. the digital output signal Draw2). The second digital signal is different from the first digital signal and corresponding to the plurality of weights. For example, when the a first bit in the first digital signal is different form a plurality of bits subsequent to the first bit in the first digital signal, the first bit of the second digital signal is different from that of the first digital signal.

Next, the calibration module adjusts the plurality of weights according to the first digital signal and the second digital signal. In an example, the calibration module adjusts a first weight corresponding to the first bit among the plurality of weights according to a difference between a first product of the first digital signal and the plurality of weights and a second product of the second digital signal and the plurality of weights. In another example, the calibration module adjusts a first weight corresponding to the first bit among the plurality of weights and the weights in front of the first weights among the plurality of weights according to a difference between a first product of the first digital signal and the plurality of weights and a second product of the second digital signal and the plurality of weights. In still another example, according to a difference between a first product of the first digital signal and the plurality of weights and a second product of the second digital signal and the plurality of weights, the calibration module adjusts a first weight corresponding to the first bit among the plurality of weights by a step. The step is equal to or smaller than the difference between the first product and the second product. The detailed operations of the calibration method 60 can be referred to the above, and are not described herein for brevity.

In addition, the calibration module may stores the plurality of adjusted weights in a storage module of the analog-to-digital converting device. When beginning operations, the analog-to-digital converting device reads the plurality of weights stored in the storage module as the reference of generating the first digital signal and the second digital signal.

Figure 7:
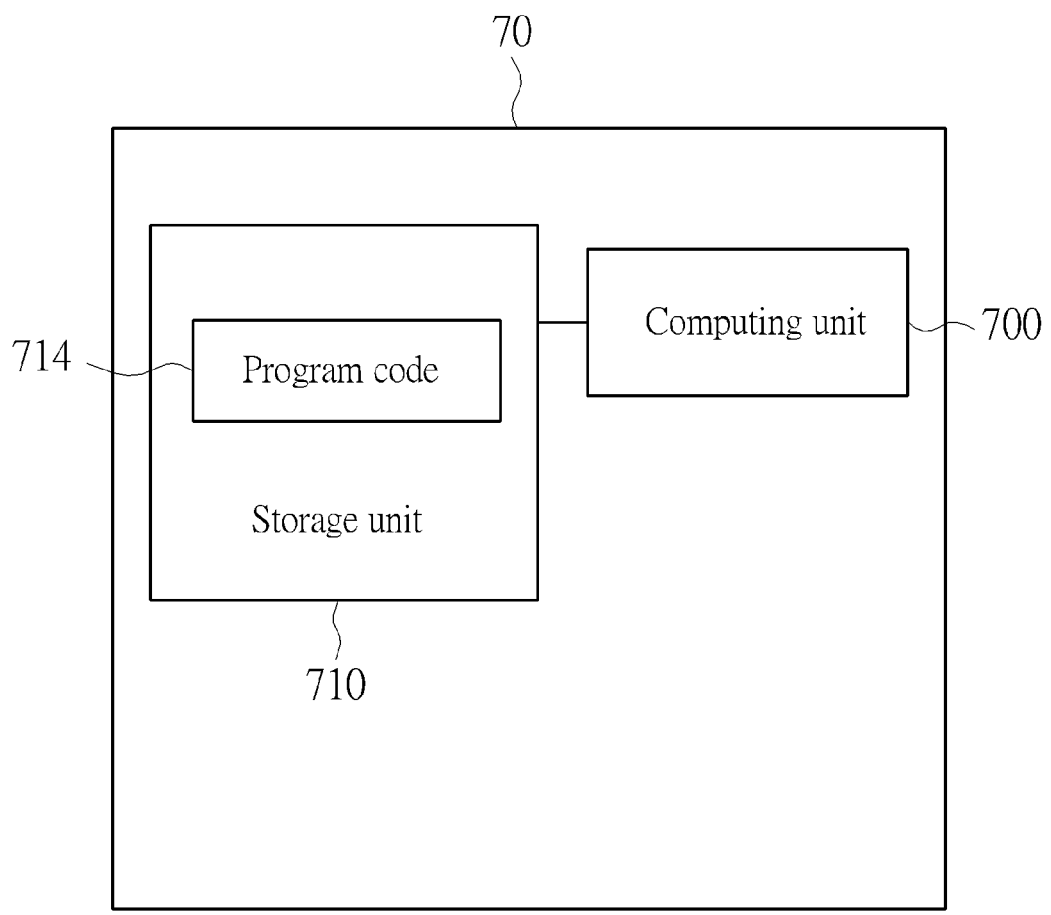
FIG. 7 is a schematic diagram of a calibration module according to an example of the present invention.

According to different applications and design concepts, the calibration module 104 may be realized in various methods. Please refer to FIG. 7, which is a schematic diagram of a calibration module 70 according to an example of the present invention. The calibration module 70 is utilized in an analog-to-digital converting device and includes a computing unit 700 such as a microprocessor or an Application Specific Integrated Circuit (ASIC) and a storage unit 710. The storage unit 710 may be any data storage device that can store a program code 714, accessed by the computing unit 700. Examples of the storage unit 710 include, but are not limited to, read-only memory, random-access memory, CD-ROM/DVD-ROM, magnetic tape, hard disk, and an optical data storage device.

In an example, the calibration method 60 can be compiled into the program code 714, to make the calibration module 70 perform the steps 600-606 according to the program code 714 and adjust the plurality of weights corresponding to the digital output signal of the analog-to-digital converting device. The non-ideal effects of the analog-to-digital converting device are therefore eliminated.

To sum up, the calibration module in the above examples adjusts the plurality of weights corresponding to the digital output signal of the analog-to-digital converting device according to the different digital output signals corresponding to the same input voltage. As a result, the analog-to-digital converting device does not need additional analog components to eliminate the non-ideal effect of the process variation.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An analog-to-digital converting device, comprising:
   a converting module, for sampling an input voltage according to a plurality of sampling signals, to generate a comparing signal;
   a control module, for adjusting the plurality of sampling signals according to the comparing signal, to generate a first digital signal corresponding to the input voltage and a plurality of weights; and
   a calibration module, for adjusting the plurality of sampling signal according to the first digital signal to make the control module generate a second digital signal corresponding to the input voltage according to the comparing signal and for adjusting the plurality of weights according to the first digital signal and the second digital signal;
   wherein the second digital signal is different from the first digital signal and is corresponding to the plurality of weights.

2. The analog-to-digital converting device of claim 1, wherein the plurality of weights comprise a first weight whose value is smaller than a sum of values of the weights subsequent to the first weight among the plurality of weights.

3. The analog-to-digital converting device of claim 1, wherein when a first bit of the first digital signal is different from a plurality of bits subsequent to the first bit in the first digital signal, the calibration module adjusts the plurality of sampling signal to make the first bit in the second digital signal different from the first bit the in the first digital signal.

4. The analog-to-digital converting device of claim 3, wherein the calibration module adjusts a first weight corresponding to the first bit according to a difference between a first product of the first digital signal and the plurality of weights and a second product of the second digital signal and the plurality of weights.

5. The analog-to-digital converting device of claim 4, wherein the calibration module adjusts the first weight corresponding to the first bit and weights in front of the first weight according to the difference between the first product and the second product.

6. The analog-to-digital converting device of claim 4, wherein the calibration module adjusts the first weight a step according to the difference between the first product and the second product.

7. The analog-to-digital converting device of claim 6, wherein the step is equal to or smaller than the difference.

8. The analog-to-digital converting device of claim 1, further comprising:
   a storage module for storing the plurality of adjusted weights.

9. A calibration method for an analog-to-digital converting device, wherein the analog-to-digital converting device samples an input voltage according to a plurality of sampling signals to generate a comparing signal and adjusting the plurality of sampling signals according to the comparing signal, so as to generate a first digital signal corresponding to the input voltage and a plurality weights, the calibration method comprising:
   adjusting the plurality of sampling signals according to the first digital signal, to generate a second digital signal corresponding to the input voltage, wherein the second digital signal is different from the first digital signal and corresponds to the plurality weights; and
   adjusting the plurality of weights according to the first digital signal and the second digital signal.

10. A calibration module, for an analog-to-digital converting device, wherein the analog-to-digital converting device samples an input voltage according to a plurality of sampling signals to generate a comparing signal and adjusting the plurality of sampling signal according to the comparing signal, so as to generate a first digital signal corresponding to the input voltage and a plurality weights, the calibration module comprising:
   a processing unit; and
   a storage unit, for storing a program code, wherein the program code instructs the processing unit performing the following steps:
   adjusting the plurality of sampling signals according to the first digital signal, to generate a second digital signal, wherein the second digital signal is different from the first digital signal and corresponds to the plurality weights; and
   adjusting the plurality of weights according to the first digital signal and the second digital signal.

* * * * *